(12) United States Patent
Cayaban et al.

(10) Patent No.: US 8,730,684 B2
(45) Date of Patent: May 20, 2014

(54) GROUND VIAS FOR ENHANCED PREAMP HEAT RELEASE IN HARD DISK DRIVES

(75) Inventors: Alex Cayaban, Fremont, CA (US); Szu-Han Hu, Pathumthani (TH); Yasunari Ooyabu, Suzuka (JP); Martin John McCaslin, Pleasanton, CA (US)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/526,887

(22) Filed: Jun. 19, 2012

(65) Prior Publication Data

US 2012/0291260 A1    Nov. 22, 2012

Related U.S. Application Data

(62) Division of application No. 12/024,857, filed on Feb. 1, 2008, now Pat. No. 8,233,287.

(60) Provisional application No. 60/888,677, filed on Feb. 7, 2007.

(51) Int. Cl.
*H05K 7/10* (2006.01)
*H05K 7/12* (2006.01)

(52) U.S. Cl.
USPC .............. 361/767; 361/679.02; 361/679.96; 174/548; 174/547

(58) Field of Classification Search
USPC ............ 361/767, 679.02, 679.96; 257/E21; 174/548, 547
See application file for complete search history.

(56) References Cited

U.S. PATENT DOCUMENTS

| | | | |
|---|---|---|---|
| 6,882,506 B2 | 4/2005 | Yamaoka et al. | |
| 2003/0002260 A1 | 1/2003 | Hasebe et al. | |
| 2003/0147178 A1 | 8/2003 | Yamaoka et al. | |
| 2004/0207073 A1 | 10/2004 | Hasebe et al. | |
| 2006/0131065 A1 | 6/2006 | Ohwaki | |
| 2007/0077686 A1* | 4/2007 | Hu ............................... | 438/117 |
| 2007/0080447 A1 | 4/2007 | Hasebe et al. | |
| 2009/0008128 A1 | 1/2009 | Hasebe et al. | |

FOREIGN PATENT DOCUMENTS

| | | |
|---|---|---|
| JP | 2003046022 A | 2/2003 |
| JP | 2003228934 A | 8/2003 |
| JP | 2005101041 A | 4/2005 |
| JP | 2006179606 A | 7/2006 |

OTHER PUBLICATIONS

Notification of Reasons for Refusal date Mar. 21, 2012 in Japanese Patent Application No. 2008026940.
Notification of Reasons for Refusal issued in corresponding JP Application No. 2008-026940 dated Nov. 27, 2012.

* cited by examiner

*Primary Examiner* — Timothy Thompson
*Assistant Examiner* — Andargie M Aychillhum
(74) *Attorney, Agent, or Firm* — Sughrue Mion, PLLC

(57) ABSTRACT

Described is a preamp flex cable for use in a hard drive. The flex cable incorporates a stiffener layer operable to provide a mechanical support, an insulating layer provided over the stiffener layer and having at least one via provided therein to expose the stiffener layer, and at least one conductive layer provided over the insulating layer. The at least one conductive layer forms an electrical circuit and at least one heat removing element that extends through the via and establishes a contact with the stiffener layer.

2 Claims, 14 Drawing Sheets

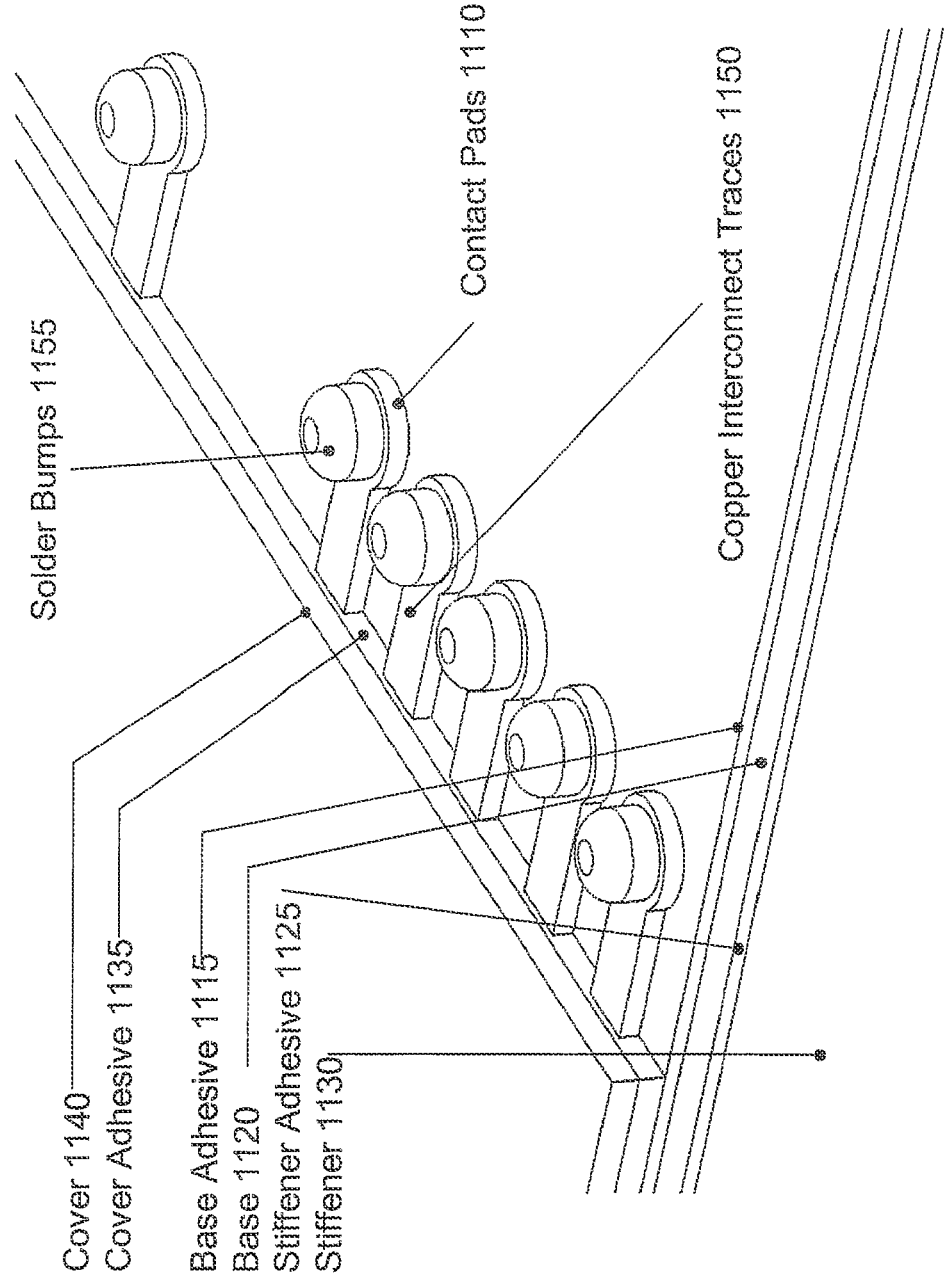

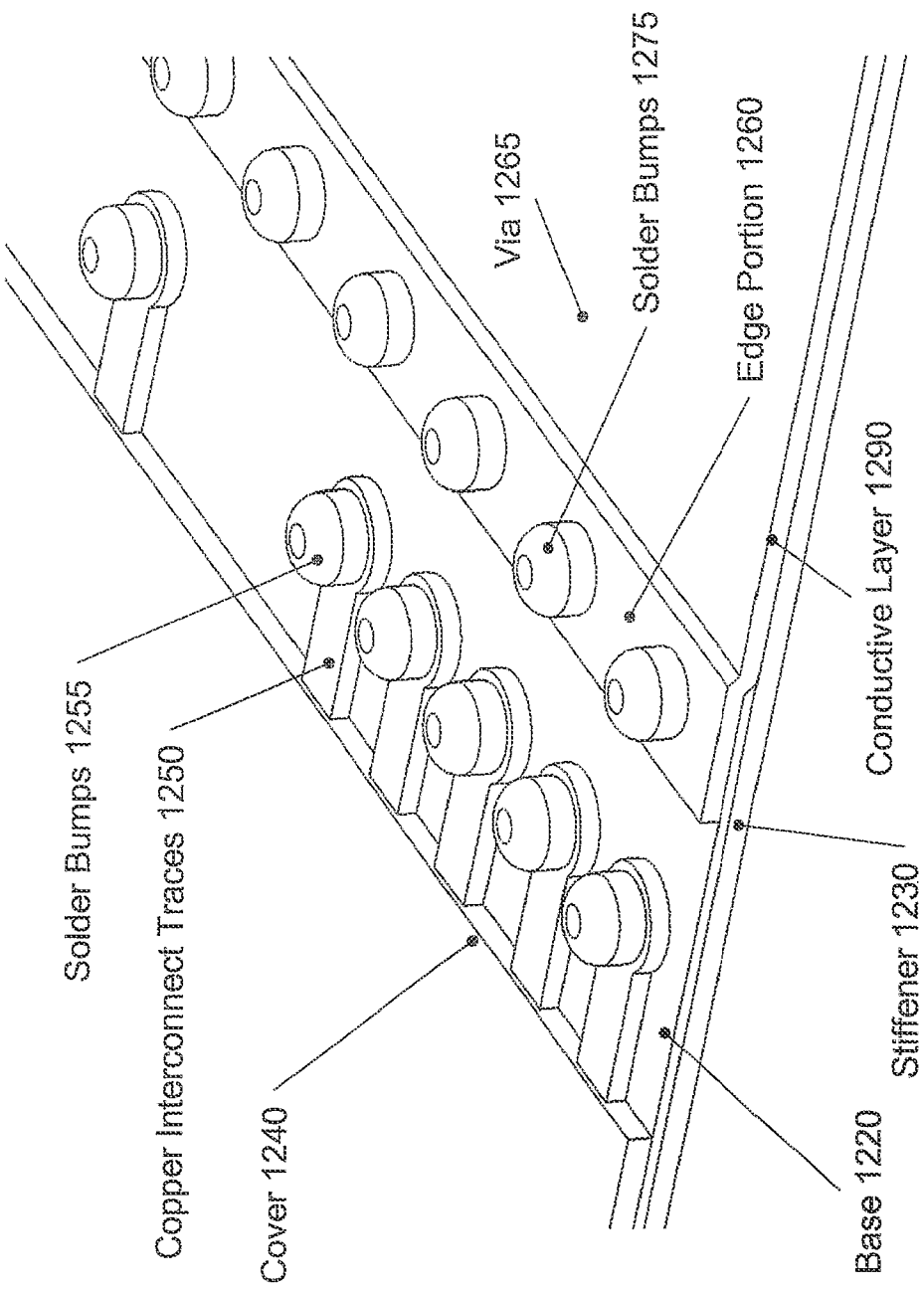

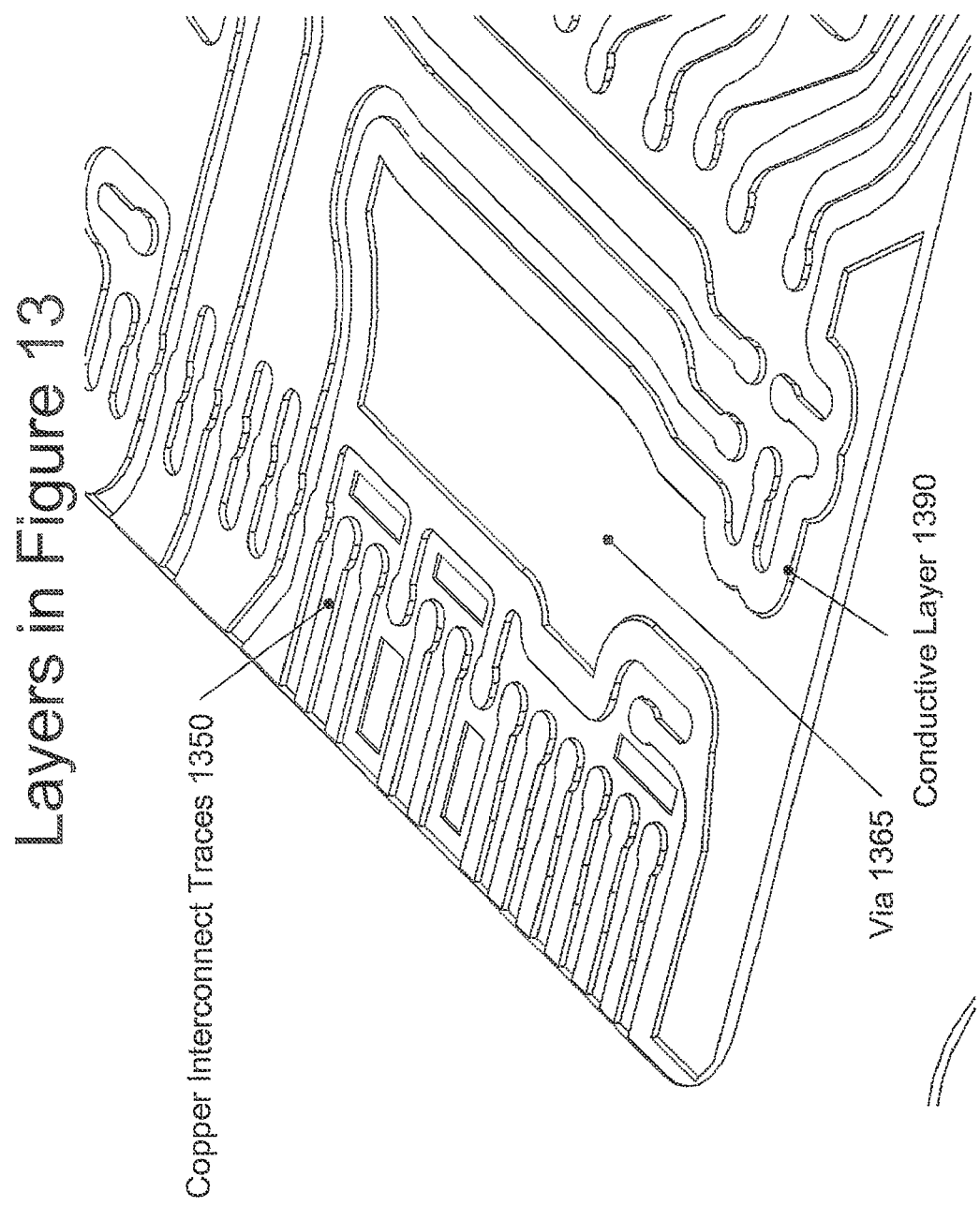

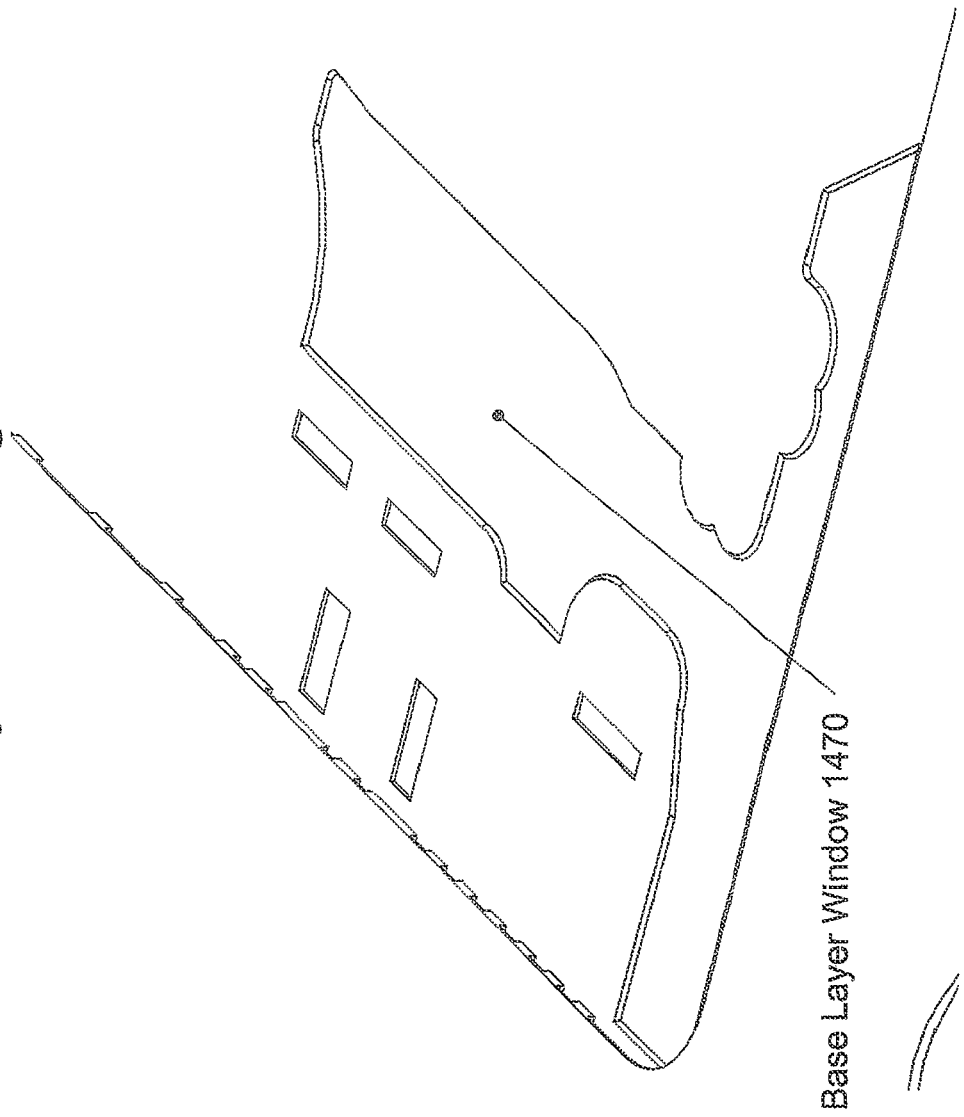

GROUND VIAS FOR ENHANCED PREAMP HEAT RELEASE IN HARD DISK DRIVES

RELATED APPLICATIONS

This Application is a divisional of U.S. patent application Ser. No. 12/024,857 filed Feb. 1, 2008, which claims priority from U.S. Provisional Application No. 60/888,677, filed Feb. 7, 2007, the disclosures of which are incorporated herein in their entirety.

BACKGROUND

1. Field of the Invention

This invention generally relates to thermal management of electronic components and more specifically to thermal management of components within a hard disk drive.

2. Description of the Related Art

In a typical hard drive configuration, a preamplifier is mounted on a flexible (flex) cable, connecting the hard disk drive head circuits with the preamplifier, which performs initial amplification of the signals received from the hard disk drive heads. Existing methods for connecting (mounting) preamplifier (preamp) chips on the flex cables of hard disk drives suffer from the lack of good heat conduction of the heat generated by the preamp to the E-block of the drive or convection path to the ambient air flow. As a result, an overheating condition may occur, resulting in a failure of the preamp and the entire hard drive, or a reduction in data throughput performance.

FIG. 1 depicts a general view of a typical preamp flex cable 100 of a hard disk drive. A preamp 101 is mounted onto the flex cable 100, and an underfill 102 is injected below and around the preamp 101, as shown in FIG. 1. The flex cable 100 also includes head circuit mounting areas 103, on which the head circuits of the hard disk drive connect electrically by solder flow, ultrasonic bonding, or other suitable means. The underfill 102 is typically made of a material having both sufficient stiffness to protect the underside BGA solder bumps, and reasonable heat conducting properties, and serves to facilitate the transmission of the heat generated by the preamp to the body of the flex cable.

FIG. 2 is a close-up cross-section view of the preamp 201 and the underfill layer 202. This figure also shows various layers that constitute the flex cable 200. Specifically, the flex cable 200 incorporates an aluminum stiffener 230, which provides mechanical support for the various flex cable layers and the electrical components mounted thereon and an interconnecting traces 250 for facilitating electrical connections between the preamp 201 and various other electrical components attached to the flex cable 200. A circuit fabrication process employing the subtractive method of patterning the interconnecting traces 250 is common for this application. The interconnecting traces 250 are insulated from the stiffener 230 using insulating base layer 220, which can be implemented using polyimide or kapton materials. A base adhesive layer 215 laminates together the base layer 220 with the interconnecting traces 250. Another insulating (polyimide or kapton) cover layer 240 is disposed on top of the copper interconnecting traces 250 and serves to insulate the electrical connections of the flex cable 201 from other components of the hard disk drive. A cover adhesive layer 235 laminates together the base adhesive layer 215 with cover layer 240, atop the interconnecting traces 250. Stiffener adhesive layer 225 attaches stiffener 230 to the circuit base layer 220.

As can be seen from FIG. 2, during the operation of the hard disk drive, to reach the aluminum stiffener 230, the heat generated by the preamp 201 has to travel through the insulating polyimide or kapton layer 220 and base adhesive layer 215. The chief problem with the conventional flex cables is that the polyimide or kapton material of the insulating layer 220 has very poor thermal conductivity properties (about 0.15 W/m-C), which results in poor heat flow between the preamp 201 and the aluminum stiffener 230, which, in turn, may cause the overheating of the preamp 201.

FIG. 3 depicts generally the same view of the flex cable 300 as FIG. 2, except that the underfill 302 is not shown. The removal of the underfill 302 exposes the contact pads 310 that make the electrical contact to the preamp. The contact pads 310 are patterned within the copper interconnecting traces 350 that are laid over the base layer 320, which is made of an insulating material, such as polyimide or kapton. As can be understood from FIG. 3, because of the presence of the thermo-insulating layer 320 underneath the preamp 301, the only path for heat conduction from the preamp is either to the ambient air, which is very low, or via the contact pads laterally outward. Interconnecting traces 350 are small in cross-section and are able to conduct only a slight amount of heat, which unfortunately still stays isolated from the stiffener as a heat sink. Also, since heat can be conducted only via the contact pads, it increases the stress load on the contact pads and may lead to their premature failure.

FIG. 4 depicts the same flex cable, but with the preamp removed for clarity. In accordance with the configuration shown in FIG. 4, the top insulating cover layer of the flex cable is marked with numeral 440. Below this layer, there is the cover adhesive 435 and conductive traces 450, which form the contact pads. Solder bumps 455 are provided, via assembly level solder flow, on the contact pads 410 to facilitate both the electrical and mechanical connections. The conductive traces 450 overlay a base adhesive 415 and insulating base layer 420, which is adhered to a stiffener 430 via stiffener adhesive layer 425.

As stated above, the conventional flex cable configuration shown in FIGS. 1 through 4 suffers from poor heat transfer away from the preamp, which may result in its overheating and failure. Thus, new, more efficient flex cable configuration is necessary.

SUMMARY OF THE INVENTION

The following summary of the invention is provided in order to provide a basic understanding of some aspects and features of the invention. This summary is not an extensive overview of the invention and as such, it is not intended to particularly identify key or critical elements of the invention or to delineate the scope of the invention. Its sole purpose is to present some concepts of the invention in a simplified form as a prelude to the more detailed description that is presented below.

The inventive methodology is directed to methods and systems that substantially obviate one or more of the above and other problems associated with conventional techniques for mounting the preamp on a flex cable of a hard disk drive.

Various aspects of the subject invention provide high levels of heat conduction (low thermal resistance) by ground vias to the stiffener material, an existing and available feature of additive circuit manufacturing technology. Layout of the trace topology under the preamp is not necessarily changed, but the ground copper has two levels. The normal upper level supports the BGA solder bumps, and a recessed layer (via) drops down through openings (windows) in the polyimide in contact with the stiffener, for example made of stainless steel, aluminum of another metal.

In accordance with one aspect of the inventive methodology, there is provided a preamp flex cable for use in a hard drive. The inventive flex cable includes a stiffener layer operable to provide a mechanical support; an insulating layer provided over the stiffener layer and having at least one via provided therein to expose the stiffener layer; and at least one conductive layer having at least a portion disposed over the insulating layer. The at least one conductive layer forms an electrical circuit and at least one heat removing element extending through the via and establishes a contact with the stiffener layer.

In accordance with yet another aspect of the inventive methodology, there is provided a preamp and a preamp flex cable assembly for use in a hard drive. The inventive assembly includes a stiffener layer operable to provide a mechanical support; an insulating layer provided over the stiffener layer and having at least one via provided therein to expose the stiffener layer; and at least one conductive layer having at least a portion disposed over the insulating layer. The at least one conductive layer forms an electrical circuit and at least one heat removing element extending through the via and establishes a contact with the stiffener layer. The inventive assembly further includes a preamp electrically coupled with the preamp flex cable.

In accordance with yet another aspect of the inventive methodology, there is provided a method involving providing a stiffener layer operable to provide a mechanical support; providing an insulating layer over the stiffener layer; forming at least one via provided in the insulating layer to expose the stiffener layer; and providing at least one conductive layer having at least a portion disposed over the insulating layer. The at least one conductive layer forms an electrical circuit and at least one heat removing element that extends through the via and establishes a contact with the stiffener layer.

In accordance with a further aspect of the inventive methodology, there is provided a preamp flex cable for use in a hard drive. The inventive preamp flex cable includes a stiffener layer operable to provide a mechanical support; an insulating layer provided over the stiffener layer and having at least one via provided therein to expose the stiffener layer; and at least one conductive layer having at least a portion disposed over the insulating layer. The at least one conductive layer forms an electrical circuit and at least one heat removing element including an upper level portion disposed over the insulating layer and a recessed level portion extending through the via and establishing a contact with the stiffener layer.

According to other aspects of the invention, the limitations of poorly conductive adhesives and polyimide layers is circumvented by the introduction of vias through windows in the polyimide or kapton insulating layer, which separates the preamp from the metal stiffener. Due to these vias, the heat is conducted more readily from the chip, to underfill, to copper, to circuit stiffener and to E-block, not depending anymore on the highly insulating adhesives & polyimide layers.

Additional aspects related to the invention will be set forth in part, in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only, and are not intended to limit the claimed invention or application thereof in any manner whatsoever.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 11 depicts a close-up of FIG. 4, showing solder bumps of the prior art.

FIG. 12 depicts a close-up of FIG. 9, showing solder bumps in an embodiment of the invention.

FIG. 13 depicts an embodiment of the invention.

FIG. 14 illustrates an embodiment of the invention consistent with FIG. 13.

DETAILED DESCRIPTION

In the following detailed description, reference will be made to the accompanying drawings, in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

Figure 1:
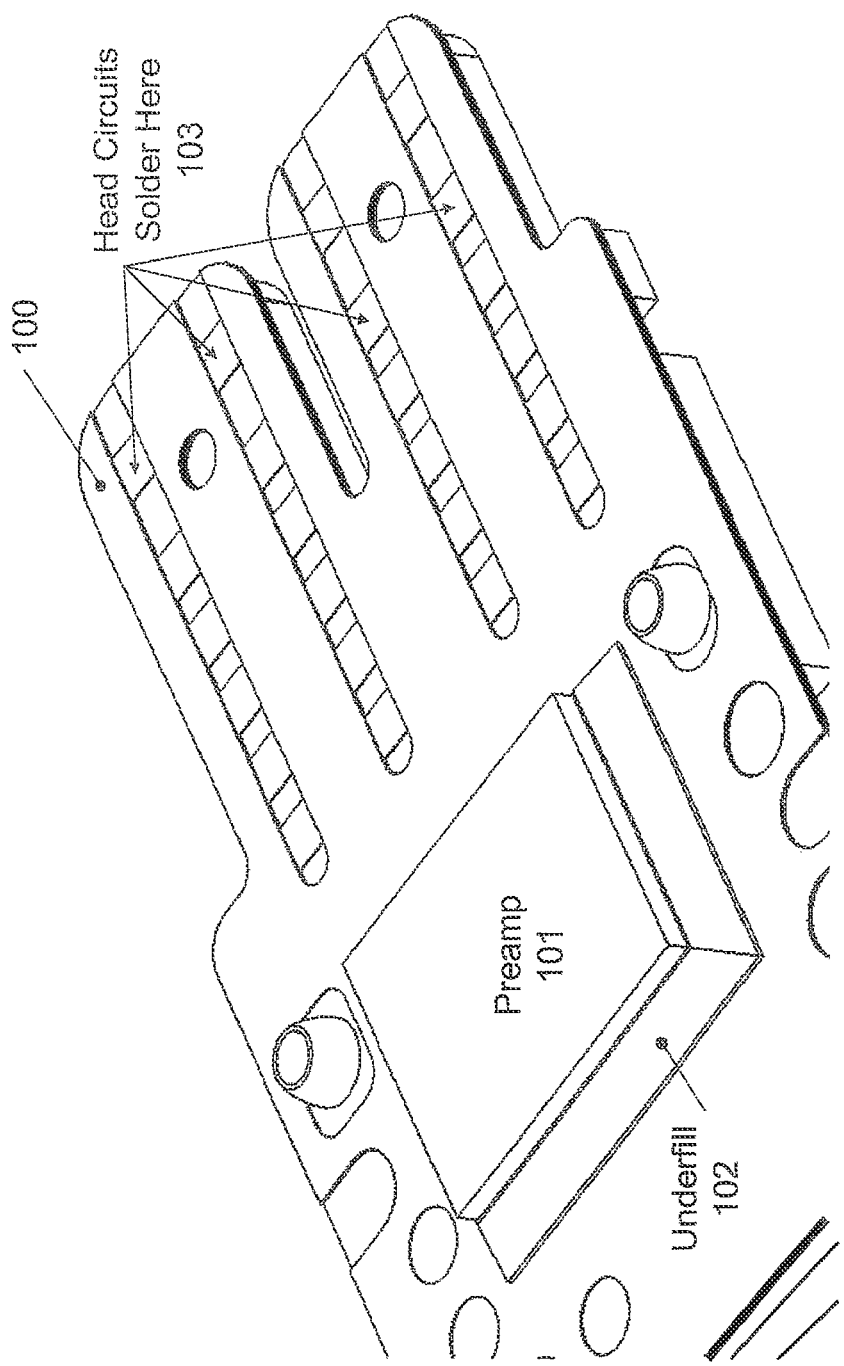
FIG. 1 is a general view of a prior art preamp flex cable.
Figure 2:
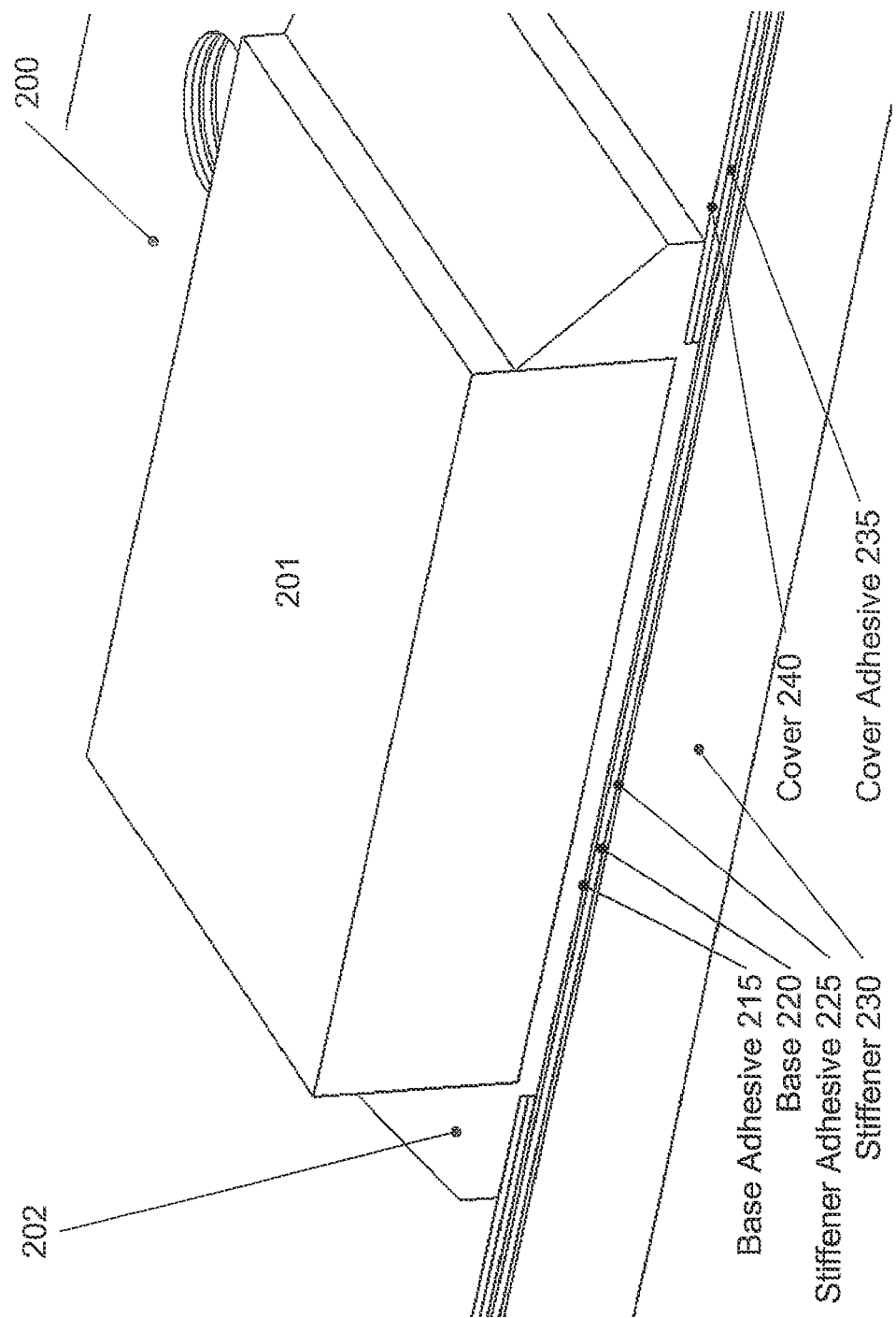
FIG. 2 is a cross-section schematic illustration prior art flex cable with preamp.
Figure 3:
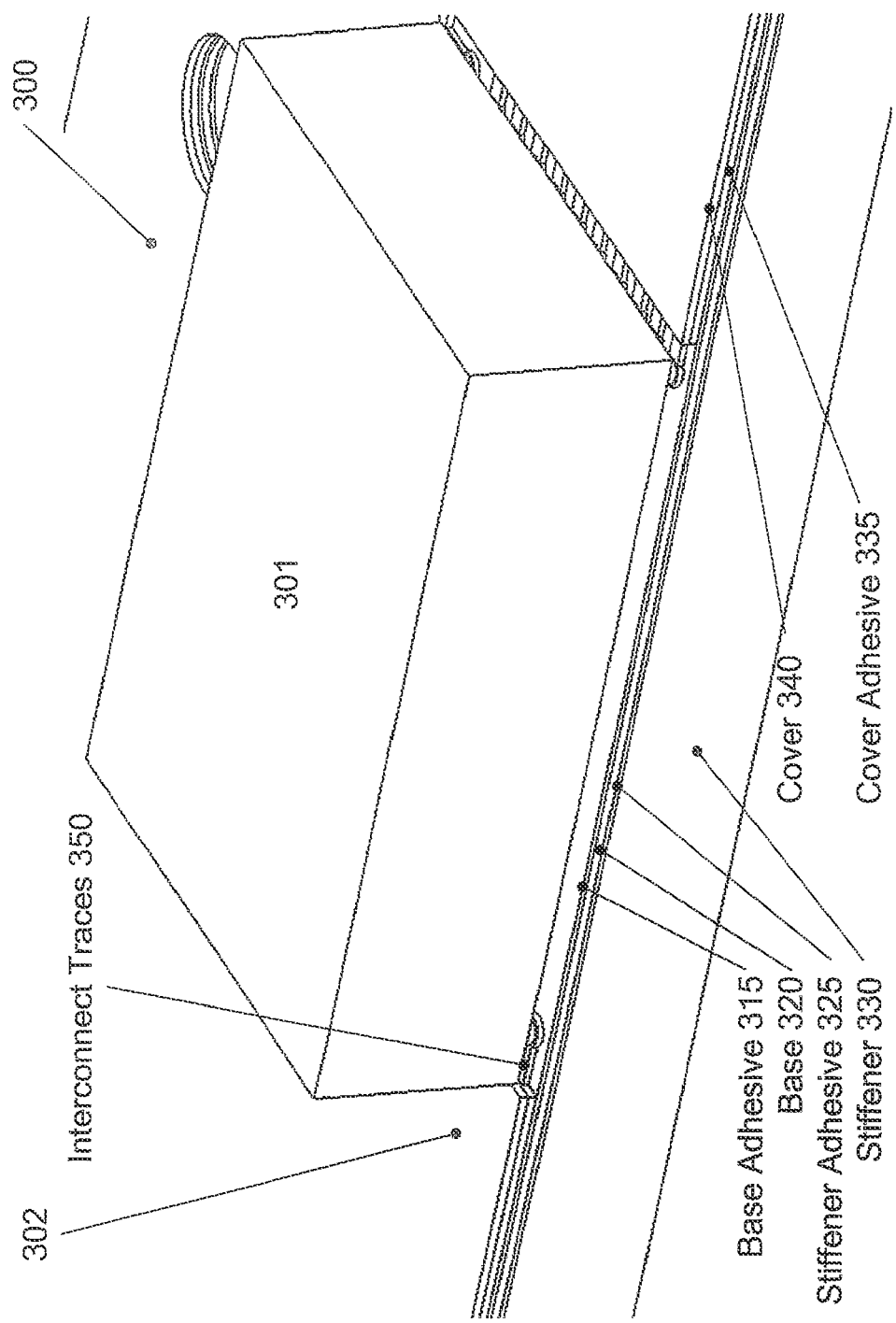
FIG. 3 depicts the preamp without the underfill.
Figure 4:
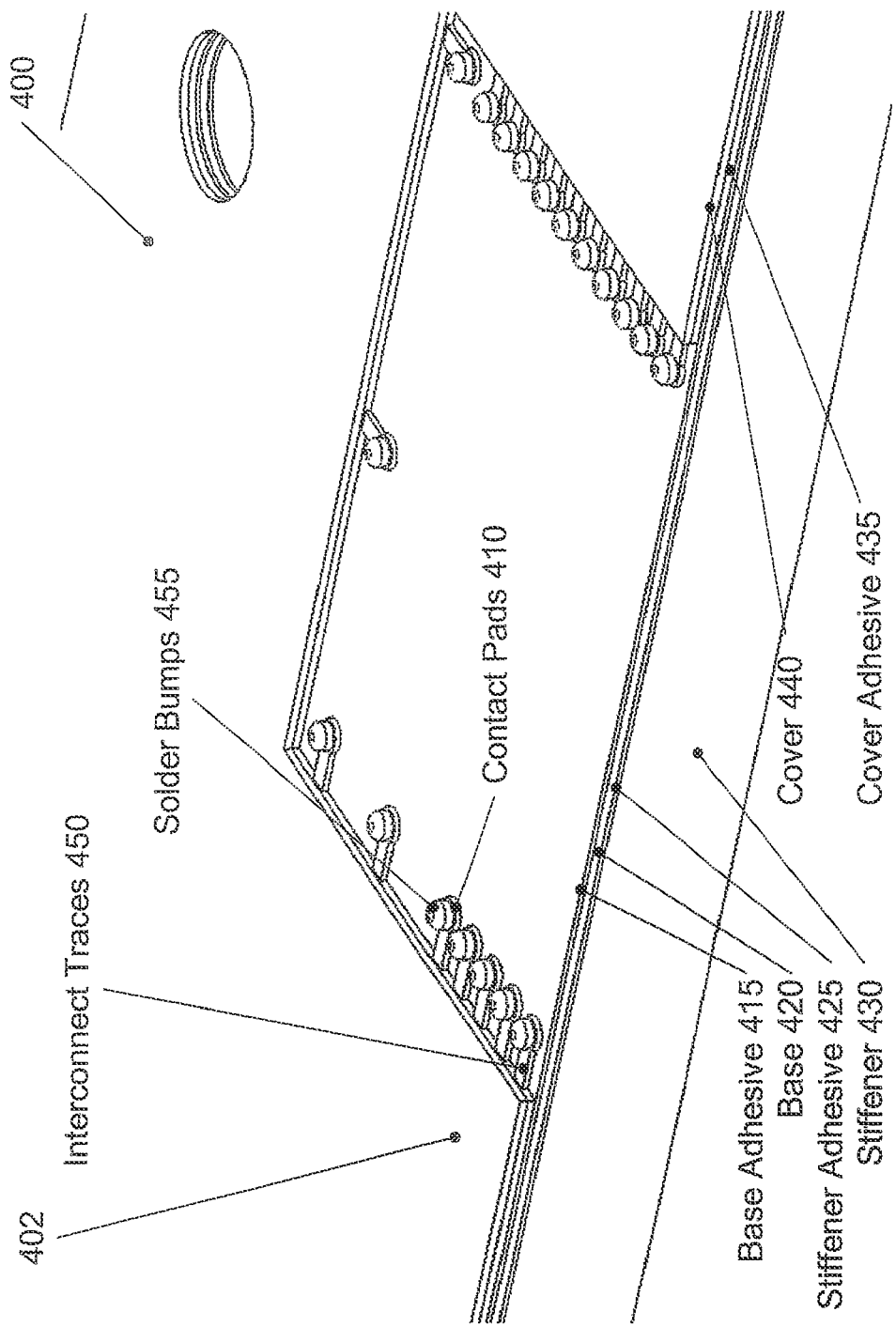
FIG. 4 depicts the layers of the flex cable without the preamp.
Figure 5:
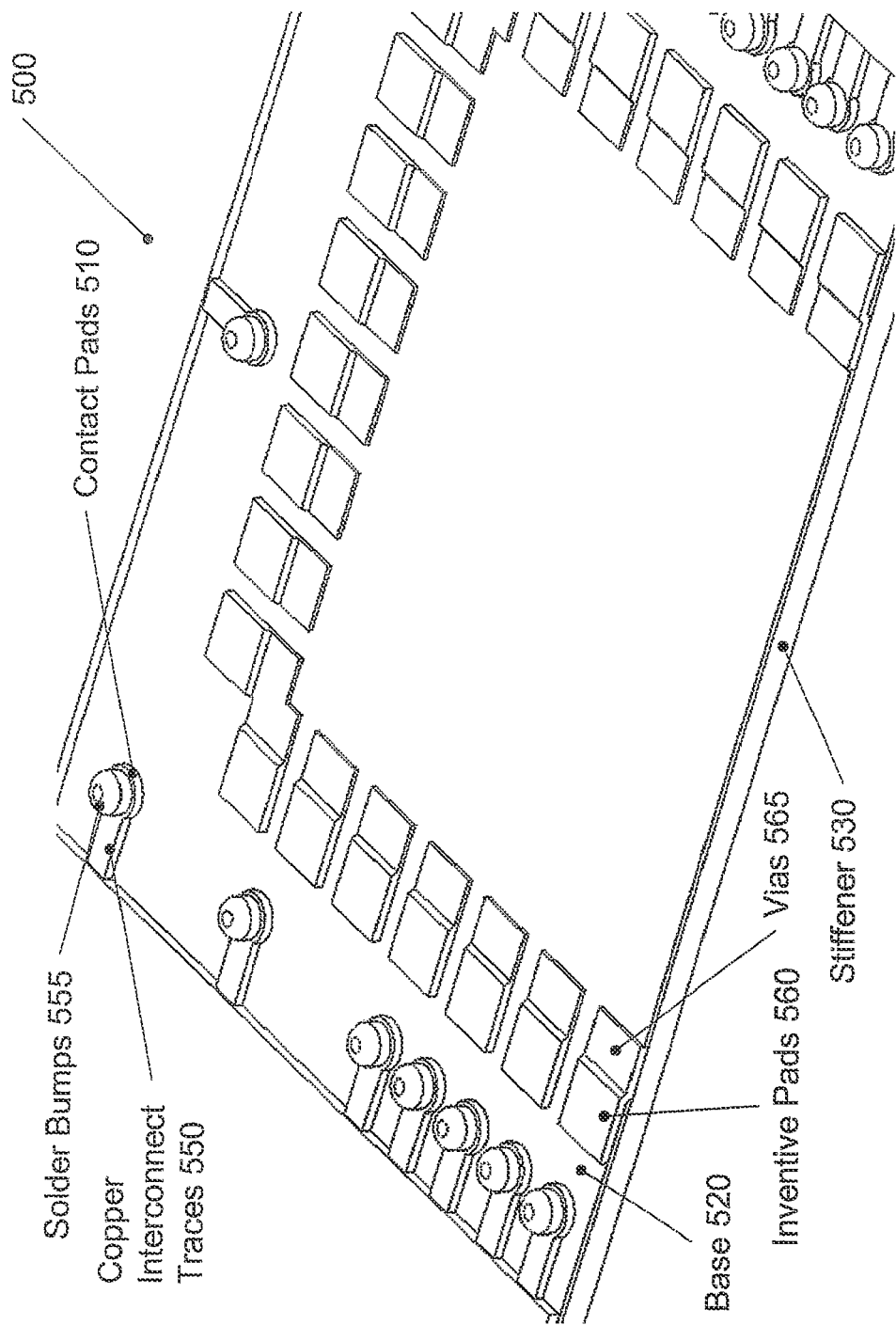
FIG. 5 illustrates one exemplary embodiment of the invention.

FIG. 5 is a schematic illustration of one exemplary embodiment of the inventive methodology. In the embodiment shown in FIG. 5, contact pads 510 and solder bumps 555 disposed thereon are conventional contact pads for establishing of an electrical contact between the preamp and the electrical circuit formed by the conductive copper interconnect traces 550 of the flex cable 500. In the shown embodiment, in addition to the conventional pads 510, a set of inventive heat conducting pads 560 are provided, which extend through vias 565 in the insulating layer 520, so as to contact the underlying stiffener layer designated in FIG. 5 by numeral 530.

In one embodiment of the invention, the layer 530 is a metal stiffener providing mechanical support for other layers of the flex cable 500. In one embodiment of the invention, the stiffener is manufactured from stainless steel. In another embodiment, the stiffener is manufactured from aluminum or aluminum alloy. In the embodiment shown in FIG. 5, the underfill (not shown) provided between the preamp and the heat conducting pads 560 and 565 facilitates the conduction of the heat from the preamp (not shown) to the heat conductive pads 560 and 565, which then conduct the heat, through the vias in the insulating layer 520, to the underlying metal layer, such as the stainless steel or aluminum stiffener 530. In one embodiment of the invention, the underfill disposed between the preamp and the heat conducting pads 560 and 565 may be a thermo-conducting paste.

In the configuration shown in FIG. 5, the heat conducting pads have two portions, which are located on two different vertical levels with respect to the plane of the flex cable 500. The first portion 560 has a rectangular shape and sits over the insulating layer 520. The second portion 565 of the heat conducting pad may also have a rectangular shape. It is directly attached to the first portion and is vertically recessed with respect to the first portion, such as to touch the stiffener 530 through the via in the insulating layer 520. The contact between the stiffener 530 and the second portion of the heat conducting pad 565, may be a thermal contact via a thermal paste or other thermal coupling, a mechanical contact based on a pressure force or an electrical contact, or any combination of the above. In another embodiment of the invention, multiple heat conducting pads 560 and 565 may be provided along a perimeter of the footprint of the preamp 501 on the flex cable 500. Such a configuration would achieve uniform heat removal from the preamp.

Figure 6:
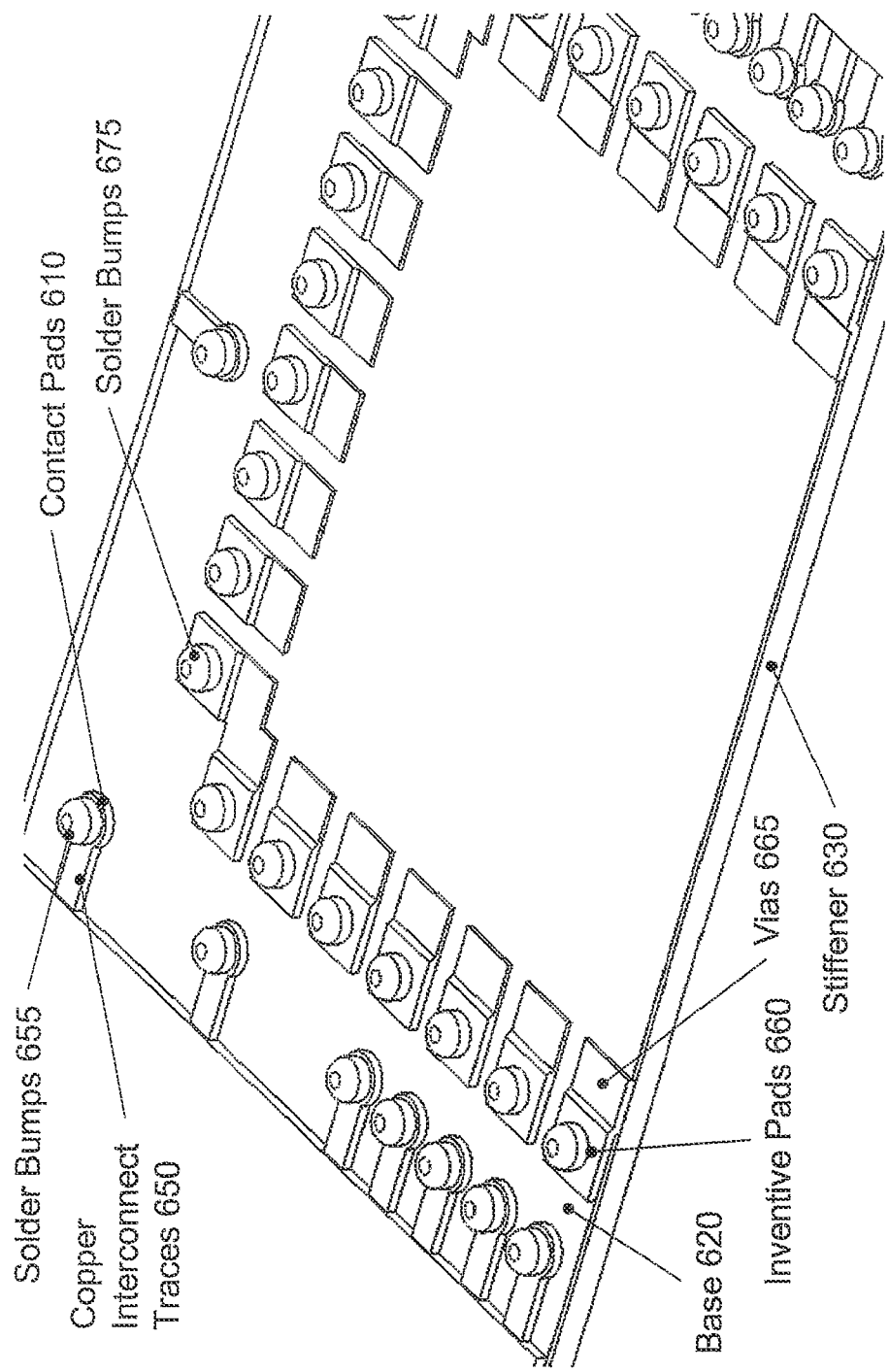
FIG. 6 illustrates another exemplary embodiment of the invention.

FIG. 6 is a schematic illustration of a second exemplary embodiment of the invention. In this embodiment, solder bumps 675 are provided on the top level portion of heat conducting pads 660. The solder bumps 675 may contact corresponding conductive pads on the preamp. According to one embodiment, these conductive pads are not connected to the electrical circuitry of the preamp, but are exclusively used to remove the heat from the preamp. Additionally, these added connections at locations 660, when attached to the preamp by means of soldering using the solder bumps 675, provide additional mechanical support for the preamp and help to remove the mechanical stress from the electrically functional conductive bond joints at location 655. That is, in an embodiment of the invention, the contacts at 675 may be used to carry the physical or mechanical loads, while contacts at bump locations 655 function only, in part, or mainly to make electrical contact.

According to another embodiment, the contact pads 675 may be connected to the ground potential of the preamp and/or ground of the flex cable circuit and may also be used to provide improved ground connection to the preamp that may reduce the noise in the system.

Figure 7:
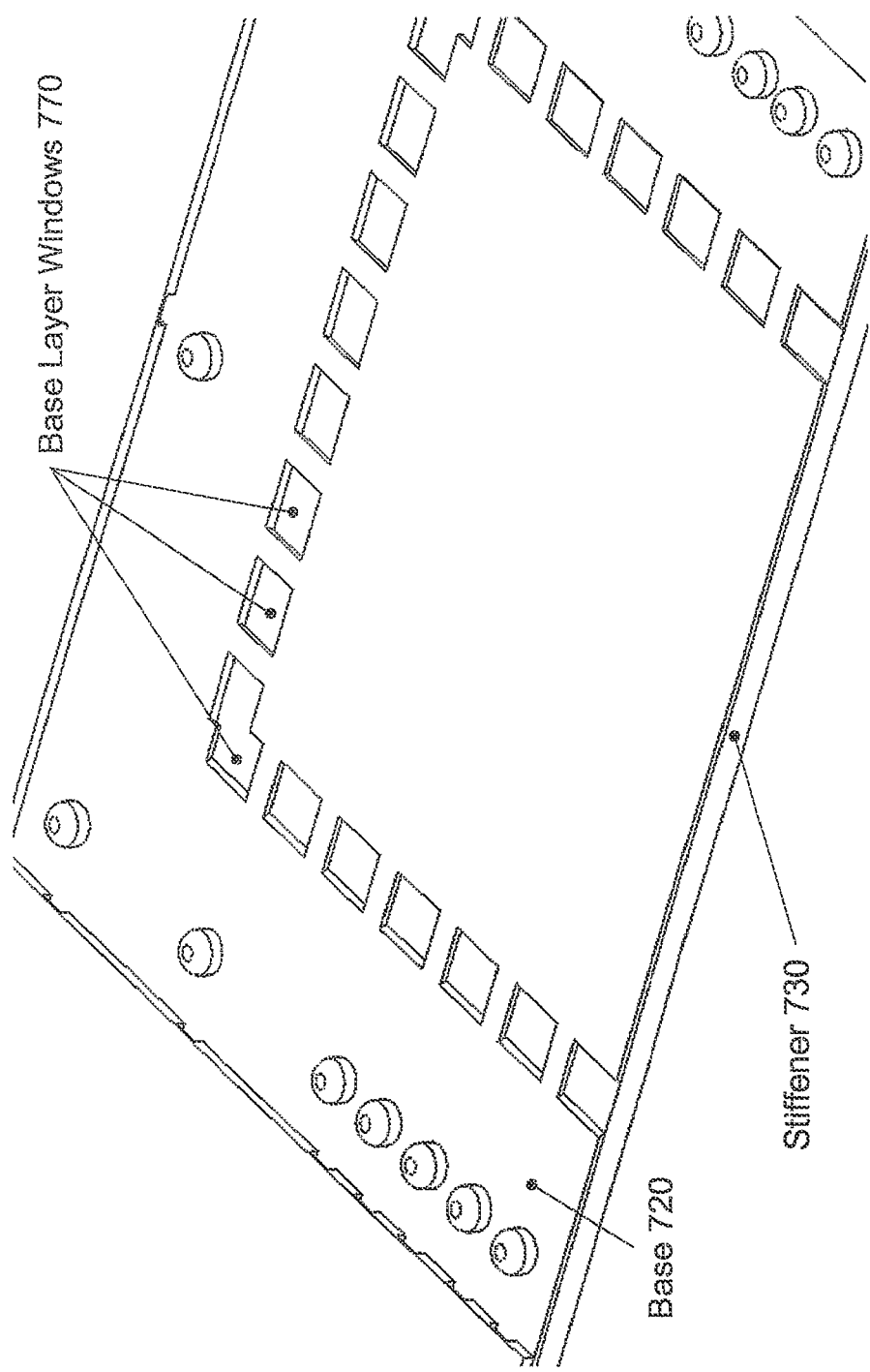
FIG. 7 illustrates an embodiment of the invention consistent with FIGS. 5 and 6.

FIG. 7 illustrates an exemplary embodiment of the insulation layer 720 consistent with FIG. 5 and FIG. 6, having the rectangular vias 770 prepared therein. The view depicted in FIG. 7 corresponds to the time point before the conductive layer (not shown) is provided on top of the insulating layer 720 to make the heat removing contacts and the electrical circuit contacts. As can be seen from FIG. 7, the rectangular vias 770 expose the rectangular portions of the underlying stiffener 730.

Figure 8:
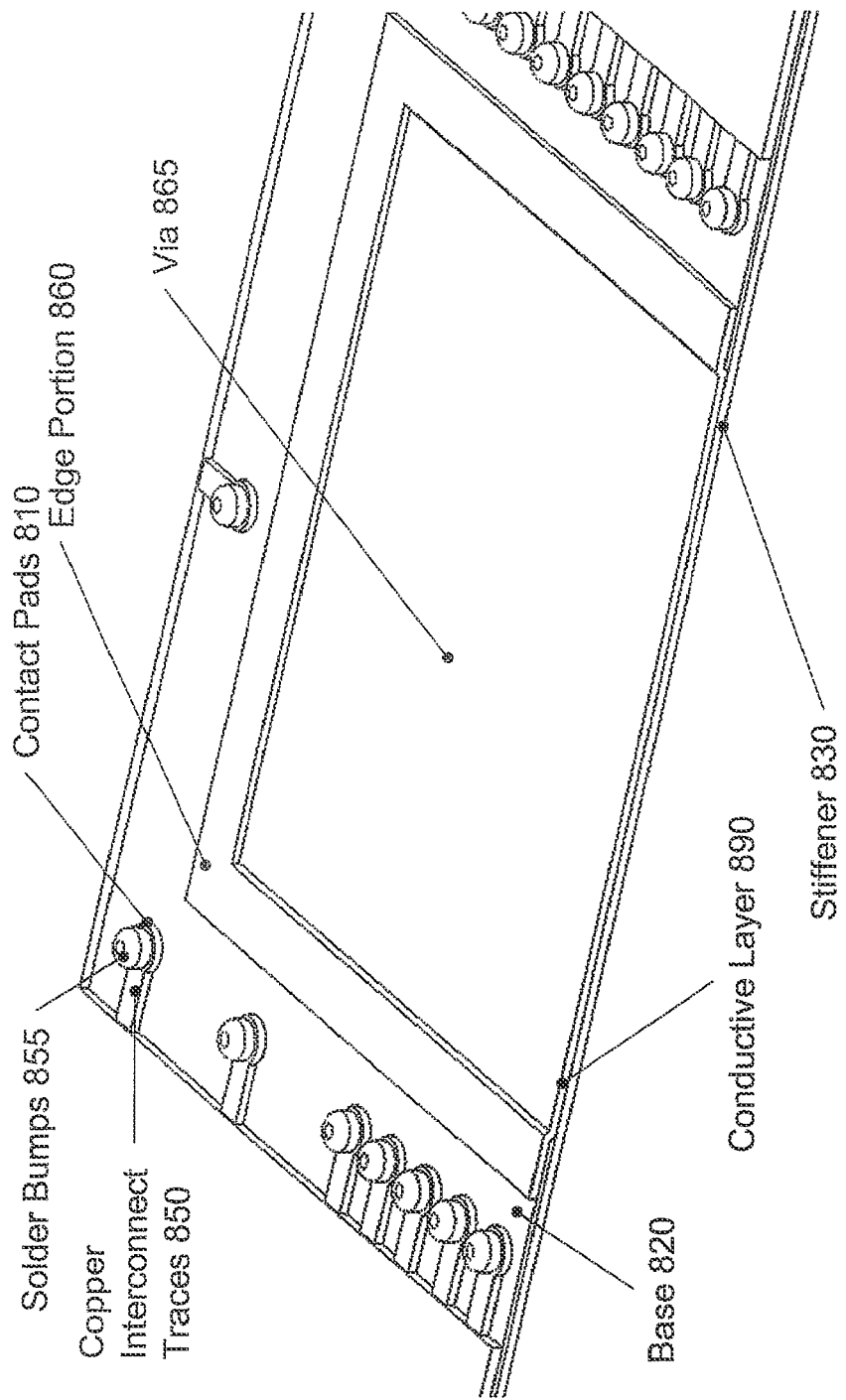
FIG. 8 depicts an embodiment of the invention.

FIG. 8 depicts another embodiment of the inventive concept, wherein an entire central section of the insulating layer has been removed, and a conductive layer 890, such as, e.g., copper, provided thereupon. The conductive layer 890 has a shape of a rectangular plate having a recessed center portion 865, which protrudes through a rectangular via in the insulating layer 820. In one embodiment of the invention, the conductive pad also includes an edge portion 860, which establishes a mechanical or electrical contact with the preamp 801 (not shown). The edge portion 860 is disposed on a different vertical level from the recessed portion with respect to the plane of the flex cable and sits on top of the insulating layer 820. Heat escapes the preamp 101, by means of an underfill provided under the preamp 801, downward and toward both the edge portions 860 and the recessed portions 865.

The conductive layer 890 makes a contact to the underlying metal stiffener layer designated by numeral 830, which may be manufactured from stainless steel or aluminum stiffener. The preamp 801 (not shown) is soldered to solder bumps 855 on the conventional contact pads 810 and an underfill (not shown) is provided between the preamp and the conductive layer 890, so as to assist in making thermal contact between the preamp and conductive layer 890 for effective heat removal. In one embodiment of the invention, the size of the conductive layer 890 is substantially the same as the size of the footprint of the preamp on the flex cable.

Figure 9:
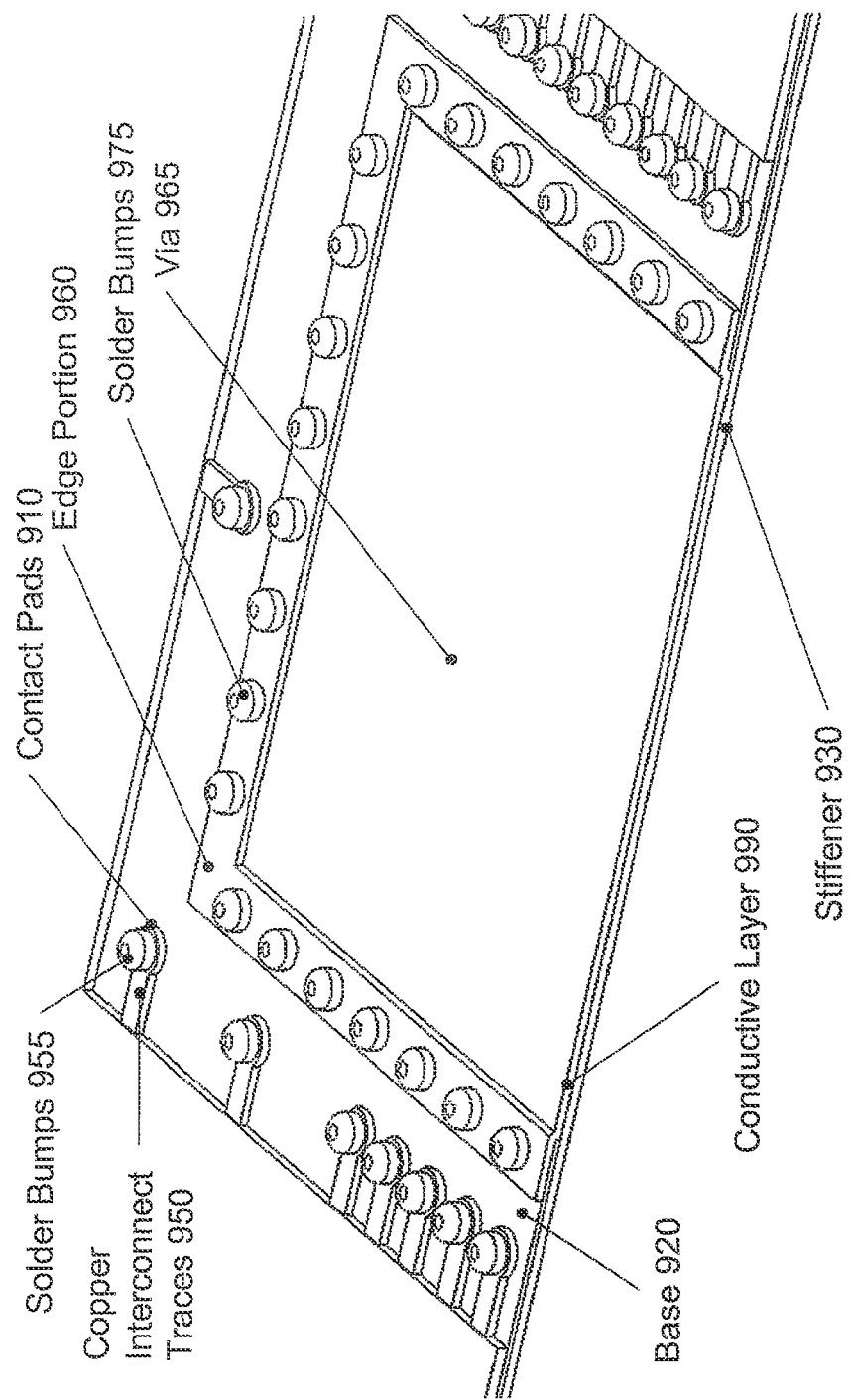
FIG. 9 depicts yet another exemplary embodiment of the invention.

FIG. 9 depicts another embodiment, which is somewhat similar to that of FIG. 8, except that solder bumps 975 are provided on the edge portion 960 of the conductive layer 990. The solder bumps may be connected to contact pads on the preamp, by means of soldering. The aforesaid contact pads of the preamp, to which the conductive layer 990 is soldered by means of the solder bumps 975, may be either electrically isolated from the circuit of the flex cable and/or circuit of the preamp or electrically connected to the ground terminal(s) of the respective circuit. As in the embodiment presented hereinabove, such configuration, wherein the conductive layer 990 carries the ground potential to the preamp, provide an improved ground connection of the flex cable circuit to the preamp that may result in the reduction of the noise in the system.

Figure 10:
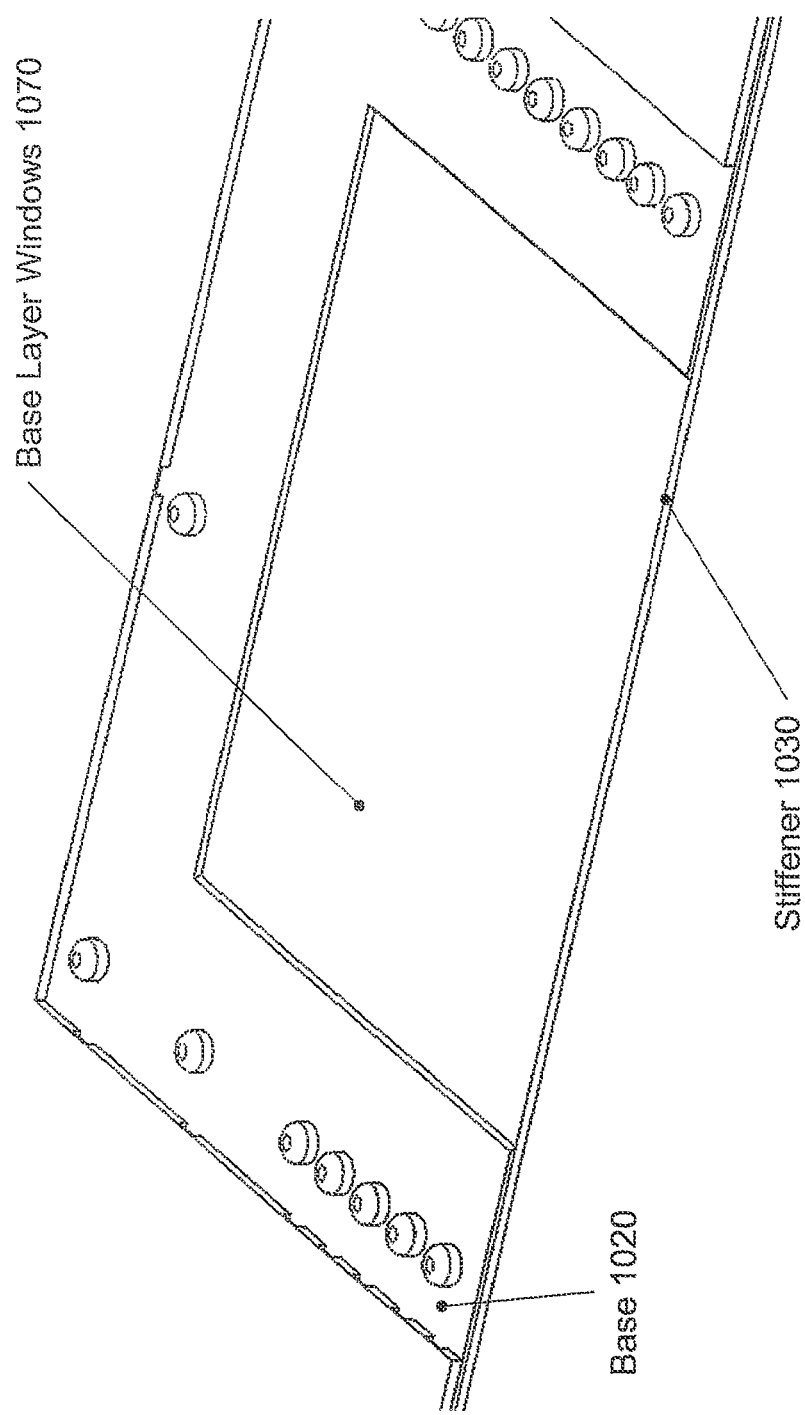
FIG. 10 illustrates an embodiment of the invention consistent with FIGS. 8 and 9.

FIG. 10 depicts the insulation layer 1020 of an embodiment of the invention shown in FIG. 8 or 9, sitting on top of the metal stiffener layer 1030 and having a central section 1070 removed in preparation for adding the conductive layer 990 (not shown).

FIG. 11 depicts the prior art contact pads 1110 with solder bumps 1155, while FIG. 12 depicts the inventive arrangement in accordance with an embodiment of the invention, with the central contact heat removal layer 1290 having solder bumps 1275 disposed on an edge portion 1260 thereof.

At times it is not feasible to remove the entire central section under the preamp, as sometimes various circuit elements are provided in that location. Therefore, according to yet another embodiment of the inventive methodology, illustrated in FIGS. 13 and 14, randomly shaped vias 1365 are provided in areas that are not utilized for an electrical circuit made of interconnecting traces 1350. The via 1365 is then provided from dual level heat conductive layer 1390, as in the embodiment shown in FIG. 8, items via 865 and heat conductive layer 890 respectively. It should be noted that solder bumps may or may not be provided on the edge heat conductive layer 1390. The shape of the heat conductive layer 1390 and via 1365 in FIG. 13, and the base window 1470 in FIG. 14, may be dictated by the shape of the area that is free from the underside preamp electrical connections.

It should be noted that the invention is not limited to any specific shapes of the vias in the insulating layer and the shapes of the conductive layer. Vias and layers can have rectangular, circular or other regular or irregular shapes. Also, the invention is not limited to any specific arrangement of the inventive vias in the insulating layer. That is, the inventive vias can be disposed in various locations of the flex cable. It should also be noted that the thicknesses of different layers of the inventive flex cable and the corresponding assemblies are exemplary only and should not be construed in a limiting sense. As would be appreciated by persons of skill in the art, any other appropriate thicknesses of various materials or layers may be utilized without departing from the spirit and scope of the claimed invention.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware will be suitable for practicing the present invention.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination for the thermal management within hard disk drive units or other devices. It is intended that the specification and examples be considered as exemplary only, with a true scope and spirit of the invention being indicated by the following claims.

What is claimed is:

1. A method comprising:
    providing a stiffener layer operable to provide a mechanical support;
    providing an insulating layer over the stiffener layer;
    forming a via provided in the insulating layer to expose the stiffener layer; and
    providing a conductive layer having a portion disposed over the insulating layer, the conductive layer forming an electrical circuit, the conductive layer further forming a heat removing element that extends through the via and establishes a contact with the stiffener layer,
    wherein the heat removing element comprises a first portion and a second portion,
    the first portion protrudes through the via in the insulating layer to couple with the stiffener layer, and
    the second portion is disposed over the insulating layer.

2. A method comprising:
    providing a stiffener layer operable to provide a mechanical support;
    providing an insulating layer over the stiffener layer;
    forming a via provided in the insulating layer to expose the stiffener layer; and
    providing a conductive layer having a portion disposed over the insulating layer, the conductive layer forming an electrical circuit, the conductive layer further forming a heat removing element that extends through the via and establishes a contact with the stiffener layer,
    wherein the heat removing element comprises a rectangular plate having a recessed center portion and an edge portion, and
    the recessed center portion protrudes through the via in the insulating layer to mechanically couple with the stiffener layer.

* * * * *